United States Patent
Hoult

(10) Patent No.: US 7,414,400 B2
(45) Date of Patent: Aug. 19, 2008

(54) DETECTION OF FERROMAGNETIC OBJECTS APPROACHING A MAGNET

(75) Inventor: David I. Hoult, Winnipeg (CA)

(73) Assignee: National Research Council of Canada, Ottawa, Ontario (CA)

( * ) Notice: Subject to any disclaimer, the term of this patent is extended or adjusted under 35 U.S.C. 154(b) by 414 days.

(21) Appl. No.: 10/510,493

(22) PCT Filed: Apr. 15, 2003

(86) PCT No.: PCT/CA03/00564

§ 371 (c)(1),
(2), (4) Date: Jun. 3, 2005

(87) PCT Pub. No.: WO03/091753

PCT Pub. Date: Nov. 6, 2003

(65) Prior Publication Data

US 2005/0242817 A1    Nov. 3, 2005

Related U.S. Application Data

(60) Provisional application No. 60/375,055, filed on Apr. 25, 2002.

(51) Int. Cl.
*G01R 33/00* (2006.01)
*G08B 13/24* (2006.01)
*G08B 21/00* (2006.01)

(52) U.S. Cl. .................. 324/260; 324/234; 324/239; 324/207.26; 340/551; 340/540

(58) Field of Classification Search ............ 324/207.24, 324/207.26, 234, 239, 260; 340/551, 540, 340/539, 12, 552, 567

See application file for complete search history.

(56) References Cited

U.S. PATENT DOCUMENTS

| 3,573,817 | A | 4/1971 | Akers |
| 3,971,983 | A | 7/1976 | Jaquet |
| 4,060,039 | A | 11/1977 | Lagarrique |
| 4,795,995 | A | 1/1989 | Eccleston et al. |
| 4,990,850 | A | 2/1991 | Votruba |
| 5,841,346 | A | 11/1998 | Park |
| 6,133,829 | A | 10/2000 | Johnstone |
| 6,150,810 | A | 11/2000 | Roybal |
| 6,337,627 | B1 * | 1/2002 | Von Gutfeld et al. ..... 340/572.1 |

(Continued)

FOREIGN PATENT DOCUMENTS

DE   43 01 611 A1   7/1994

(Continued)

*Primary Examiner*—Patrick Assouad
*Assistant Examiner*—David M. Schindler
(74) *Attorney, Agent, or Firm*—Adrian D. Battison; Michael R. Williams; Ryan W. Dupuis

(57) ABSTRACT

An apparatus for detecting a potentially dangerous ferromagnetic object carried inadvertently by a person approaching the magnet of a magnetic resonance imaging system (14) uses the fringe field (16) of the magnet and provides guide members (11) defining a path along which the person is prescribed to pass. The path (11) is generally or approximately parallel to the field the path. At least one sense coil and generally two sets of sense coils (12, 13) are located on respective sides of the path (11) s the movement of the ferromagnetic object in the field of the magnet causes a voltage to be generated in the sense coil.

20 Claims, 3 Drawing Sheets

U.S. PATENT DOCUMENTS 6,362,739 B1* 3/2002 Burton ....................... 340/551
6,567,685 B2* 5/2003 Takamori et al. ............ 600/410
7,106,056 B2 9/2006 Czipott
7,113,092 B2 9/2006 Keene 2003/0171669 A1* 9/2003 Kopp ........................ 600/410

FOREIGN PATENT DOCUMENTS

DE    199 12 407 A1    9/2000

* cited by examiner

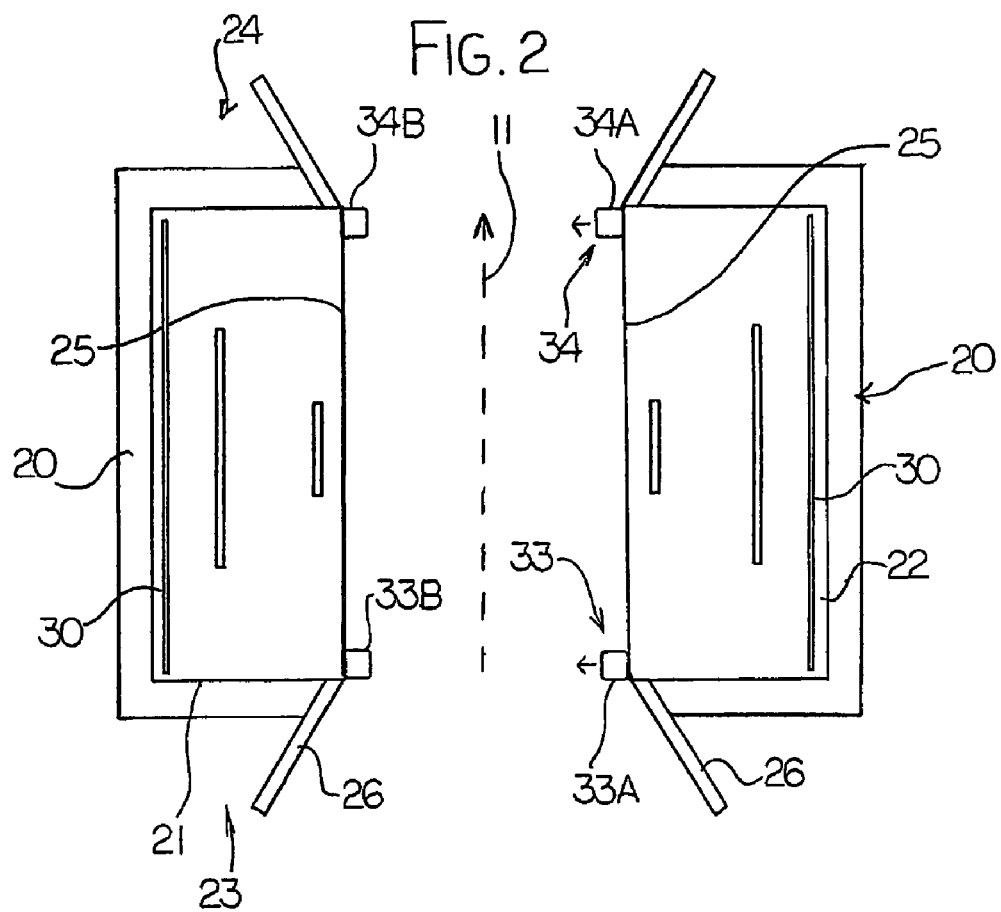
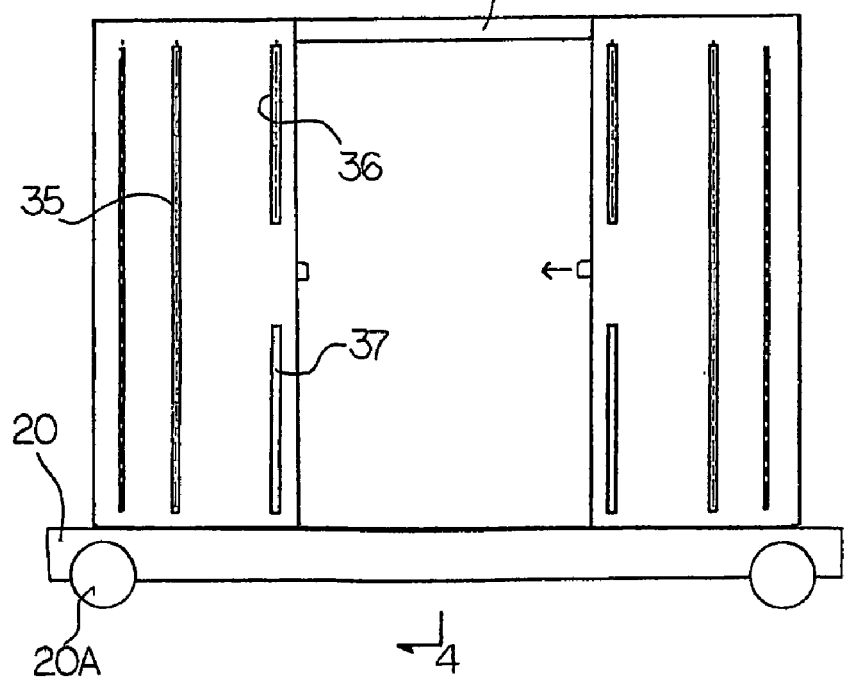

DETECTION OF FERROMAGNETIC OBJECTS APPROACHING A MAGNET

This application claims priority under 35 U.S.C. 119 from U.S. Provisional Application Ser. No. 60/375,055 filed Apr. 25, 2002.

The invention relates to the detection of ferromagnetic objects and in particular, it relates to a method of and apparatus for detecting ferromagnetic objects of a variety of sizes in the magnetic field created by a high strength magnet such as the imaging magnet of a magnetic resonance imaging machine or other similar magnets.

BACKGROUND OF THE INVENTION

The inadvertent introduction of ferromagnetic objects into the space surrounding high strength magnets such as magnetic resonance imaging magnets and magnets used in magnet guided catheterisation presents an ongoing hazard to both patients and staff in clinical imaging facilities. Such objects, if brought too close to the large magnet that encompasses a patient during scanning, can effectively become missiles that can seriously injure or even kill patient and staff alike, and tragically, more than one fatality has occurred. It is believed that no device exists to protect against the danger. The term "high strength" used herein is intended to include any magnet which has a field strength sufficient that ferromagnetic objects brought into the field can become dangerous.

While normal metal detectors can detect ferromagnetic objects, they also detect non-magnetic metal that can, and routinely is, safely brought up to the magnet. Such detectors therefore give a large number of false alarms and thereby lose any semblance of protective effectiveness.

Current detectors of only ferromagnetic objects assume free-standing use in a non-magnetic environment. Generalising, a first design genre aims to generate a time-varying, low audio-frequency, magnetic field and to observe the changes in that field (via the changes in the inductance of the generating system) caused by the introduction of a ferromagnetic object. However, the creation of such magnetic fields close to an imaging system is proscribed as it interferes with the imaging procedure. A second genre aims to detect changes in the earth's field when a ferromagnetic object moves close by. For such a detection method to have sufficient sensitivity, ferrites are used to enhance the voltages induced in detection coils. However, unless such a detector is to be situated an inconvenient distance from the magnetic resonance imaging suite, the fringe field of the imaging magnet will tend to saturate the ferrites, resulting in greatly impaired efficiency. Further, the presence of a large ferromagnetic object in the magnet suite, that is the detector itself, is potentially dangerous and therefore also proscribed.

SUMMARY OF INVENTION

In accordance with one aspect, the invention provides an apparatus for use with a magnetic resonance imaging magnet in detecting a ferromagnetic object approaching the magnet, the apparatus comprising:

guide members defining a path along which persons, who are approaching the magnet and potentially transporting a ferromagnetic object, are prescribed to pass;

said guide members being arranged such that said path is located, in use, in the magnetic field of the magnet;

at least one sense coil mounted at the guide members and arranged at a predetermined location and orientation relative to the guide members such that, as a person transporting a ferromagnetic object to be detected passes along the prescribed path, the movement of the ferromagnetic object in the field of the magnet causing a voltage to be generated in the at least one sense coil;

and an electrical measuring device for measuring an electrical signal generated by the sense coil when the ferromagnetic object travels in the path, the electrical measuring device being arranged to provide a warning indication when the electrical signal exceeds a predetermined value.

In order to provide the best signal, path and field are preferably substantially parallel. However the field and the path may not be directly parallel provided the signal is sufficient, particularly bearing in mind that the signal is proportional to the cosine of the angle between the field and the path.

Preferably at least one coil is of rectangular section and provides substantially vertical coil legs at spaced positions along the path.

In this arrangement, preferably the substantially vertical coil legs at spaced positions along the path have a height of the order of the height of a person walking along the path since the vertical sections of the coils provide the signal and hence the vertical sections should be maximized and the horizontal sections should be arranged such that they are physically located in a position which minimises physical interference and difficulties.

In this arrangement, preferably at least one coil lies in a plane generally parallel to the path along one side of the path with the horizontal sections at the floor and above the height of the person.

To provide symmetry and to allow cancellation of outside signals, it is preferred that there be at least two coils arranged to provide on each side of the path two substantially vertical coil legs at spaced positions along the path.

If necessary to maximise signal to noise ratio, there may be provided at least one additional coil on each side of the path shaped and arranged to cancel components of electrical signal generated by fields or movements outside of the path. There are then two sets of coils, one on each side of the path.

In this arrangement, preferably each set of coils includes an outermost largest coil, an intermediate coil smaller than the outermost coil, and two innermost coils which are each smaller than the intermediate coil and arranged one above the other. In this arrangement, preferably each of the coils of the set provides substantially vertical coil legs at spaced positions along the path with interconnecting top and bottom coil portions lying in a common plane at the top and bottom of the path.

In a preferred arrangement, the sense coils define a zone within the coils and there is provided a device for detecting entry of the person into and departure of the person from the zone. This can be used to operate the device only when the passage of a person is detected so as to minimise false signals caused by extraneous activities. In this arrangement, preferably the electrical measuring device is arranged to provide an integral of the electrical signal as the person moves through the zone. This integral can be used to avoid slow movement of the object through the path from defeating the detection system. In this arrangement, preferably the at least one coil includes two vertical coil legs at spaced positions along the path and the detecting device is arranged at the legs so as to define the zone therebetween.

If necessary to reduce unacceptable noise by movement of the coils within the field, the at least one coil can be mounted on at least one anti-vibration platform.

In accordance with a second aspect of the invention there is provided a combination of a high strength magnet and the apparatus for use in detecting a ferromagnetic object approaching the magnet as defined above, wherein the apparatus is mounted in the fringe field of the magnet.

The apparatus may include a device for combining in predetermined fractionalities electrical signals from the sense coils, or an electrical measuring device for measuring a combined electrical signal generated by the sense coils when the ferromagnetic object travels in the path, or an electrical device for measuring the temporal integral of the combined electrical signal generated by the sense coils.

The method includes steps of moving a ferromagnetic object along a predetermined path located in the magnetic field and generating electrical signal in at least one sense coil located at a predetermined location and orientation relative to the path and the magnetic field. The method further includes steps of processing the generated signal and determining the presence of the ferromagnetic object in response to the processed signal.

BRIEF DESCRIPTION OF THE DRAWINGS

One embodiment of the invention will now be described in conjunction with the accompanying drawings in which:

FIG. 2 is a top plan view of the apparatus of FIG. 1 showing a more complex sense coil construction.

FIG. 3 is a front elevational view of the apparatus of FIG. 2.

DETAILED DESCRIPTION

The apparatus for detecting a ferromagnetic object is generally indicated at 10 and comprises guides forming a path 11 between a pair of sensor coils 12 and 13. The sensor coils are arranged so that the path 11 is located in the fringe field of a magnet 14 of a magnetic resonance imaging system.

The construction arrangement of the magnet can vary and is well known to one skilled in the art so that further detail of the magnetic resonance imaging system is not necessary here. The magnet however forms a main field within a longitudinal bore 15 of the magnet where the sample to be analysed is located. The magnet, however, forms a fringe field including field lines schematically indicated at 16—again a very conventional well-known arrangement. At a suitable location in the fringe field, the path 11 is located so that the path at that position is generally parallel to the field lines. One example among many, wherein the field lines are generally at right angles to the axis of the bore of the magnet, is shown.

Figure 4:
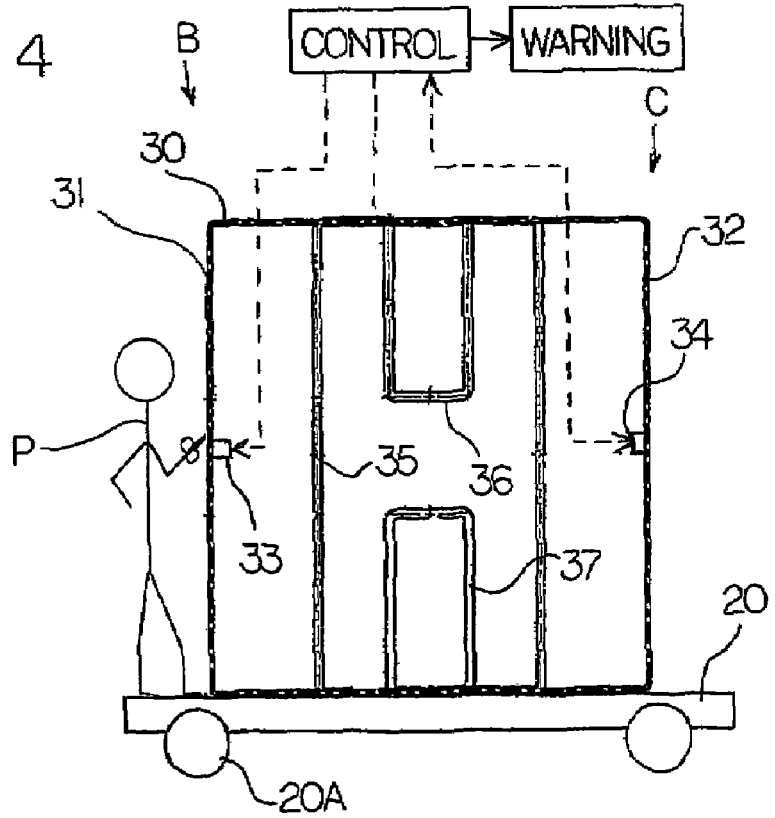
FIG. 4 is a view along the lines 4-4 of the apparatus of FIG. 2.

In FIGS. 2, 3 and 4 the detection apparatus is shown in more detail and comprises a platform 20 on which is mounted two containers 21 and 22 each on a respective side of the path 11 which extends over the platform. An inlet ramp 23 and an outlet ramp 24 may be provided but this is not preferred, as wheelchairs and gurneys must pass. As an alternative, two anti-vibration platforms can be used, one under each set of coils with the path defined between them. The containers 21 and 22 each are generally rectangular and provide an inner wall 25 which acts to define sides of the path 11 along which the personnel are required to pass. Suitable inlet guide surfaces 26 are provided which direct the person onto the path 11 so as to pass between the containers 21 and 22. The containers enclose the sensor coils so that the coils are arranged on opposite sides of the path 11.

Figure 1:
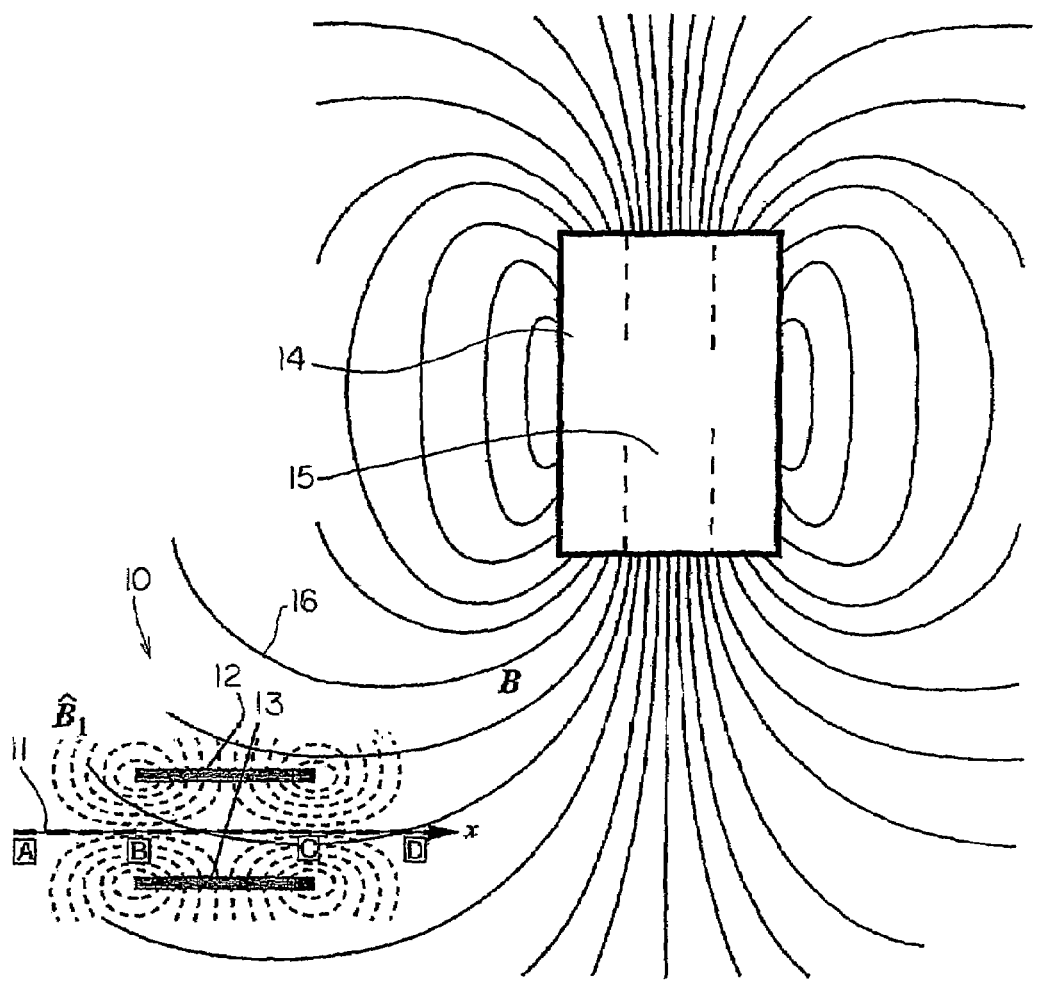
FIG. 1 illustrates schematically the arrangement of imaging magnet and sense coils according to one embodiment.
Figure 5:
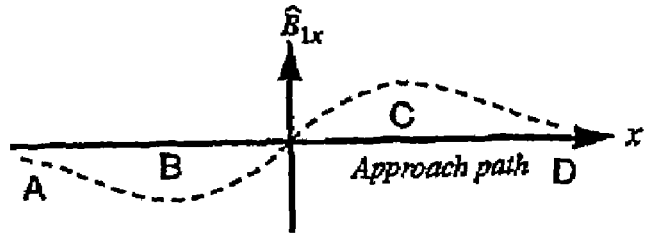
FIGS. 5 and 6 illustrate schematically the detection operation of the inventive device.
Figure 6:
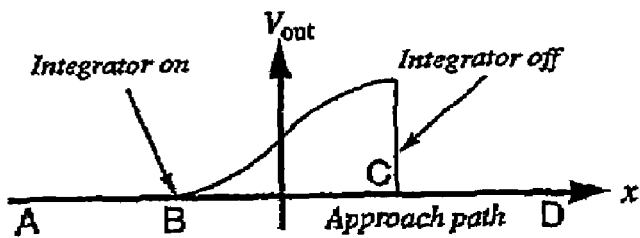

The sensor coils include a main coil 30 which defines a pair of vertical legs 31 and 32 defining a main zone of the sensor system. The leg 31 is located at the point B in the system as shown in FIG. 1 and the leg 32 is arranged at the point C in the system as shown in FIG. 1. Thus a person schematically indicated at P enters along the line of the path and is guided onto the pathway 11 by the guide surfaces 26 so as to pass between the legs of the main coils 30. An optical sensing system 33 is located at the entry into the zone of the sensor system at the point B and includes a transmitter 33A and a receiver 33B for detecting the passage of the person P. Similarly a second sensor 34 is located at the outlet point C and includes a transmitter 34A and a receiver 34B.

The coils further include secondary coils 35 and tertiary coils 36 and 37. The coils 35 are spaced inwardly relative to the outer most main coils 30 but have the legs thereof spaced by a smaller distance as shown best in FIG. 4. The tertiary coils 36 and 37 are spaced yet further inwardly from the secondary coils and are arranged to have a height less than the half of the height of the primary and secondary coils and located one above the other. The tertiary coils are spaced inwardly from the secondary coils and have a width which is less than the width of the secondary coils.

The arrangements of coils is selected as shown so that the primary, secondary and tertiary coils when connected in series provide an output signal in which extraneous electrical signals generated by events external to the pathway are substantially reduced. This arrangement therefore maximises the actual signal generated by the passage of a ferromagnetic object along the path relative to extraneous signals generated by other movements and vibrations.

The primary, secondary and tertiary coils are arranged in planes parallel to the centre plane of the path 11. The legs of the coils are vertical and the horizontal coils at the top and bottom of the vertical legs are arranged in common horizontal planes at the platform and at a height above the head of the person so that the person passes through a sensing zone defined within the external envelope of the main coil.

The platform or platforms 20 can be located on vibration dampening air bag systems generally indicated at 20A so as to isolate the sensing system from building vibrations.

Accordingly, the invention provides a walk-through method of detection of ferromagnetic objects that relies on the surrounding or "fringe" field of the imaging magnet itself to enhance sensitivity by heavily magnetising the ferromagnetic object. With this design, the closer the detection apparatus is to the magnet, the more sensitive it is and the smaller the amount of material that can be detected. There is thus a pleasing (and mathematically related) correspondence with the need to keep large objects, such as oxygen cylinders, far away, while smaller ones, such as scissors, can be brought closer. One could thus, if necessary, envisage different zones of protection which are entered through detectors of increasing sensitivity as the magnet is approached.

In the preferred embodiment, the fringe field of the magnet causes approaching ferromagnetic material to be heavily magnetised. This magnetised material is then detected from the temporal integral of the electronically-amplified voltage induced in a pair of many-turn sense coils, wound in series but opposition, that lie at the sides of the path of approach to the magnet, as shown in FIG. 1. As an example, the main coils 30 may be rectangular, having a width of 1.2 m, a height of 2.1 m and a separation of 1.5 m, each possessing 5000 turns of wire. Other shapes, dimensions, separations and numbers of turns are feasible.

The fringe field B of the imaging magnet in this preferred embodiment has a substantive component parallel to the approach path of average strength of the range of, say, 1 to 50 millitesla. (The earth's field is typically of the order of 50 microtesla.) When a ferromagnetic object travels along the approach path 11, it becomes heavily magnetised in the fringe field and induces a voltage in the coils that is proportional to i. the strength of the magnetic moment, ii. the speed of motion and iii. the gradient of the hypothetical magnetic field $\hat{B}_1$ that would be produced if unit current were to be passed through the sense coils. (It is stressed that no current is actually passed though these coils; the hypothetical field is merely a mathematical convenience to enhance insight.) It will now be shown that the integral in time of the induced voltage over a given distance along the approach path (for example, from one end of the sense coils, point B to the other, point C) is independent of the speed and is only a function of the magnetic moment and the geometry of the sense coil (size, number of turns, etc.). Thus the device cannot be defeated by a slow approach, as is the case with some detectors.

The fringe field B of the imaging magnet heavily magnetises any ferromagnetic object therein—the object becomes a magnet m whose strength depends, in the usual linear approximation, on the properties of the material and the strength of the fringe field:

$$m = \beta B V \tag{1}$$

Note that m is a vector parallel to B. In this linear approximation, $\beta$ is a constant dependent on the magnetic properties and shape of the material and V is the volume of that material. The voltage induced in a conductor by a changing magnetic moment can be shown to be $$E = \frac{\partial}{\partial t}(\hat{B}_1 \cdot m) \tag{2}$$

If, for simplicity, we assume that the approach path is a straight line along the x axis, as shown in FIG. 1, and that m is substantively constant over that path, then as, along the path, the $\hat{B}_1$ field is always in the x direction, $$E \cong \frac{dx}{dt}\frac{\partial}{\partial x}(\hat{B}_1 \cdot m) \equiv m_x \frac{dx}{dt}\frac{\partial \hat{B}_{1x}}{\partial x} \tag{3}$$

where $\hat{B}_{1x}$ is the component of $\hat{B}_1$, and $m_x$ is the component of m along the path. Derivative dxdt is the speed of movement along the path. It follows that the temporal integral of the voltage E is $$V_{out} = \int_{t_B}^{t_C} m_x \frac{dx}{dt}\frac{\partial \hat{B}_{1x}}{\partial x} dt = \int_B^C m_x \frac{\partial \hat{B}_{1x}}{\partial x} dx = m_x \Delta \hat{B}_{1x} \tag{4}$$

In words, the temporal integral $V_{out}$ of the voltage as a magnetic object travels the approach path is given by the strength of the magnetic moment (with its dependence on fringe field and volume given by equation (1)), and the difference $\Delta\hat{B}_{1x}$ in the field strength $\hat{B}_{1x}$ between the start and the end of integration. In the example in the figure, the greatest difference in the hypothetical field $\hat{B}_{1x}$ is that between points B and C and thus the integrator is only turned on as an object is detected passing point B. It is turned off when that object leaves the "active volume" of the sensor—the volume encompassed by the sensor coils and essentially that volume between points B and C. The presence of an object in the "active volume" may be sensed optically, by radar, ultrasound, a pressure mat, etc. Not only does this mode of operation help to confound attempts to defeat the sensor, it also helps protect against false alarms caused by distant large passing objects (e.g. a truck outside), for the sensor is only activated when its "active volume" is entered. An alarm is triggered when $V_{out}$ exceeds a predetermined threshold in a manner that is sufficiently well-known as not to need description.

It will be appreciated by those skilled in the art of electromagnetics that a variety of approach paths and sense coil designs can be posited so as to accommodate differing directions of the fringe field relative to that of the approach path. Merely the simplest and arguably the best design has been described. The clear criterion given by equation (2) is that the hypothetical field $\hat{B}_1$ from the sense coils must have a substantive component parallel to magnetic moment m and therefore parallel to the fringe field B and that the scalar product $\hat{B}_1 \cdot m$ must vary greatly over the approach path.

The following considerations can be given in deciding the arrangements and designs of the coils. The arrangement described thus far shows two coils, one at each side of the path, having windings in opposition. The hypothetical field generated is similar to that from two coils in opposition straddling the path. However if the two coils lie "across" the path, you have to step through them, i.e. over the bottom portion of the windings. A ramp could be provided over the windings but in the arrangement as shown the bottom horizontal windings are along the sides and no ramp is needed. Having the windings at the side also means that they can be cross-braced as indicated at 40 to help prevent vibration. Other configurations are possible and may well be needed if, by reason of the architecture of the imaging suite, the approach path must be substantially perpendicular to the direction of the fringe field. However, such a situation would be unusual as one wants access to the front of the magnet, not the side. Note that the criterion of the fringe field and the approach path's being substantially parallel in the preferred arrangement is not an onerous one. The scalar product of Eq. (2) implies a dependence as cosine a where a is the angle between the two different directions. Thus, even with a 45 degree angle, there is only a reduction of sensitivity to 71% of full.

Using a self-shielding technology well-known in magnet design, sense coils, or combinations of such coils, can be produced that reduce substantially the hypothetical field $\hat{B}_1$ distant from the sensors and thereby reduce correspondingly the likelihood of external interference by a large, distant, moving magnetic object such as a truck.

While a single sense coil could be employed with a reduction of a factor of two in sensitivity, the use of two coils connected in series opposition reduces substantially magnetic interference from external sources, as common-mode induced voltages then cancel. Not least of the sources of interference are the switching of the magnetic field gradients inside the imaging magnet, and fields at the mains frequency of, say, 60 Hz with harmonics thereof.

The use of an integrator at the control unit tends to average out any residual voltages induced by such fields. Excessive drift of the integrator caused by temperature-dependent changes of direct offset voltages in the amplified sensor coil outputs can easily be eliminated with the use of sample-and-hold techniques, for the period of integration is at most a few seconds. The integrator is preferred because it protects against false alarms, vibration and slow motion but its use is not essential to gain the benefits of the invention.

Passing alongside, rather than through, the sense coils reduces the risk of their being knocked. As they lie in the fringe field of the magnet, any motion of the sense coils induces a large voltage that could trigger an alarm. Physically connecting the two sense coils with cross-beams 40 at their tops discourages independent motion. The induced voltage due to common motion is substantially reduced by the opposed windings of the coils. It is advisable to mount the sensor windings on rubber, or if necessary, anti-vibration platforms, to reduce the transmission of vibration from the floor.

The arrangement described above has the following important features:

The use of the fringe field of the imaging magnet itself to enhance the sensitivity of detection of ferromagnetic objects to a reliably useful level;

The use of auxiliary sensing of an object in the "active volume" of the sensor to turn the sensor on, thereby reducing the capacity for external perturbations to trigger a false alarm;

The use of integration of the voltage induced in the sense coils to confound attempts to defeat the sensor by slow movement, and to reduce the deleterious effects of interference.

The use of more than one sense coil to reduce the deleterious effects of interference.

Since various modifications can be made in my invention as herein above described, and many apparently widely different embodiments of same made within the spirit and scope of the claims without department from such spirit and scope, it is intended that all matter contained in the accompanying specification shall be interpreted as illustrative only and not in a limiting sense. In particular, there may be disciplines other than magnetic resonance imaging where the invention could be of use.

The invention claimed is:

1. An apparatus for use in detecting a ferromagnetic object, the apparatus comprising:
    guide members defining a path along which persons, who are potentially transporting a ferromagnetic object, are prescribed to pass;
    said guide members being arranged such that said path is located, in use, in a magnetic field;
    a pair of sensing assemblies mounted at the guide members and arranged at a predetermined location and orientation relative to the guide members such that, as a person transporting a ferromagnetic object to be detected passes along the prescribed path, the movement of the ferromagnetic object in the magnetic field causes a voltage to be generated in the sensing assemblies;
    and an electrical measuring device for measuring an electrical signal generated by the sensing assemblies when the ferromagnetic object travels in the path, the electrical measuring device being arranged to provide a warning indication when the electrical signal exceeds a predetermined value;
    wherein the sensing assemblies each include a primary sensing device and at least one secondary sensing device spaced at a different distance relative to the primary sensing device from the path and arranged to reduce components of electrical signal generated by fields or movements outside of the path sufficiently to avoid false warning indications caused by said fields or movements.

2. The apparatus according to claim 1 wherein the sensing assemblies comprise sense coil assemblies; and wherein the sense coil assemblies are wound in opposition and connected in series so as to reduce magnetic interference from external sources.

3. The apparatus according to claim 2 wherein the sense coil assemblies provide substantially vertical coil legs at spaced positions along the path and on opposite sides of the path.

4. The apparatus according to claim 2 wherein the sense coil assemblies lie in a plane generally parallel to the path along respective sides of the path.

5. The apparatus according to claim 2 wherein the sense coil assemblies each include a primary coil and at least one secondary coil shaped and arranged to cancel components of electrical signal generated by fields or movements outside of the path.

6. The apparatus according to claim 5 wherein each of the sense coil assemblies includes an outermost largest primary coil, an intermediate secondary coil smaller than the outermost coil, and two secondary innermost coils which are each smaller than the intermediate coil and arranged one above the other.

7. The apparatus according to claim 6 wherein each of the sense coil assemblies provides substantially vertical coil legs at spaced positions along the path with interconnecting top and bottom coil portions lying in a common plane at the top and bottom of the path.

8. The apparatus according to claim 2 wherein the sense coil assemblies define a detection zone along the path and there is provided a device for detecting entry of the person into and departure of the person from the detection zone.

9. The apparatus according to claim 8 wherein the electrical measuring device is arranged to provide an integral of the electrical signal as the person moves through the detection zone.

10. The apparatus according to claim 2 wherein the sense coil assemblies and the path are mounted on at least one anti-vibration platform.

11. The apparatus according to claim 1 wherein the sensing assemblies comprise sense coil assemblies; wherein the sense coil assemblies are wound in opposition and connected in series so as to reduce magnetic interference from external sources; and wherein the sense coil assemblies each include a primary coil and at least one secondary coil shaped and arranged to cancel components of electrical signal generated by fields or movements outside of the path.

12. The apparatus according to claim 11 wherein the sense coil assemblies provide substantially vertical coil legs at spaced positions along the path and on opposite sides of the path.

13. The apparatus according to claim 11 wherein the sense coil assemblies lie in a plane generally parallel to the path along respective sides of the path.

14. The apparatus according to claim 11 wherein each of the sense coil assemblies includes an outermost largest primary coil, an intermediate secondary coil smaller than the outermost coil, and two secondary innermost coils which are each smaller than the intermediate coil and arranged one above the other.

15. The apparatus according to claim 11 wherein each of the sense coil assemblies provides substantially vertical coil legs at spaced positions along the path with interconnecting top and bottom coil portions lying in a common plane at the top and bottom of the path.

16. The apparatus according to claim 11 wherein the sense coil assemblies define a detection zone along the path and there is provided a device for detecting entry of the person into and departure of the person from the detection zone.

17. The apparatus according to claim 16 wherein the electrical measuring device is arranged to provide an integral of the electrical signal as the person moves through the detection zone.

18. The apparatus according to claim 11 wherein the sense coil assemblies and the path are mounted on at least one anti-vibration platform.

19. The apparatus according to claim 1 wherein the sense coil assemblies define a detection zone along the path and there is provided a device for detecting entry of the person into and departure of the person from the detection zone.

20. The apparatus according to claim 1 wherein the sensing assemblies and the path are mounted on at least one anti-vibration platform.

* * * * *